(12) United States Patent
Bailey et al.

(10) Patent No.: US 6,470,036 B1
(45) Date of Patent: Oct. 22, 2002

(54) TUNABLE EXTERNAL CAVITY SEMICONDUCTOR LASER INCORPORATING A TUNABLE BRAGG GRATING

(75) Inventors: Timothy J. Bailey, Longmeadow, MA (US); Robert N. Brucato, Waterbury, CT (US); Michael A. Davis; Alan D. Kersey, both of Glastonbury, CT (US); Martin A. Putnam, Cheshire, CT (US); Paul E. Sanders, Madison, CT (US); James S. Sirkis, Wallingford, CT (US)

(73) Assignee: CiDRA Corporation, Wallingford, CT (US)

( * ) Notice: Subject to any disclaimer, the term of this patent is extended or adjusted under 35 U.S.C. 154(b) by 160 days.

(21) Appl. No.: 09/705,326

(22) Filed: Nov. 3, 2000

(51) Int. Cl.[7] ................................................. H01S 3/10
(52) U.S. Cl. ............................. 372/20; 372/6; 372/64; 372/102; 372/92; 385/37
(58) Field of Search ...................... 372/20, 102, 64, 372/6, 92; 385/37, 12

(56) References Cited

U.S. PATENT DOCUMENTS

| | | | | |
|---|---|---|---|---|
| 5,469,520 A | * | 11/1995 | Morey et al. | 385/37 |
| 5,691,999 A | * | 11/1997 | Ball et al. | 372/20 |
| 5,717,804 A | | 2/1998 | Pan et al. | 385/94 |
| 5,719,974 A | | 2/1998 | Kashyap | 385/37 |
| 5,844,667 A | * | 12/1998 | Maron | 356/35.5 |
| 5,914,972 A | * | 6/1999 | Siala et al. | 372/34 |
| 5,930,430 A | | 7/1999 | Pan et al. | 385/94 |
| 5,987,200 A | * | 11/1999 | Fleming et al. | 385/37 |
| 6,091,744 A | | 7/2000 | Sorin et al. | 372/20 |
| 6,229,827 B1 | * | 5/2001 | Fernald et al. | 372/20 |
| 6,363,089 B1 | * | 3/2002 | Fernald et al. | 372/20 |

FOREIGN PATENT DOCUMENTS

WO    WO 00/45482    8/2000

* cited by examiner

Primary Examiner—Leon Scott, Jr.
(74) Attorney, Agent, or Firm—Ware, Fressola, Van Der Sluys & Adolphson LLP

(57) ABSTRACT

A tunable external cavity semiconductor laser incorporating a tunable Bragg grating, including: a semiconductor gain medium; an elongated tuner housing having a tuner housing head and having a tuner housing foot, the tuner housing head and tuner housing foot being rigidly connected; a span of waveguide having a Bragg grating, for receiving the source light and for providing in turn the reflected light, and having a waveguide head and a waveguide foot, the waveguide head abutting the tuner housing head and the waveguide foot disposed toward the tuner housing foot; a piezoelectric crystal or other device or arrangement for providing a compressive force, disposed so as to abut the waveguide foot and also to abut the tuner housing foot, the means for applying a compressive force for exerting a compressive force on the span of waveguide along the direction of the axis of the span of waveguide, the compressive force being sufficient to alter the grating so as to affect the wavelength of light reflected by the grating. In some applications, the waveguide includes sections of different thicknesses, each having a sampled grating, the two sampled gratings being created so that at any given compressive force exerted by the piezoelectric crystal, the two gratings reflect at most one wavelength in common. The tunable laser in such an application therefore behaves as a stepped tunable laser.

11 Claims, 5 Drawing Sheets

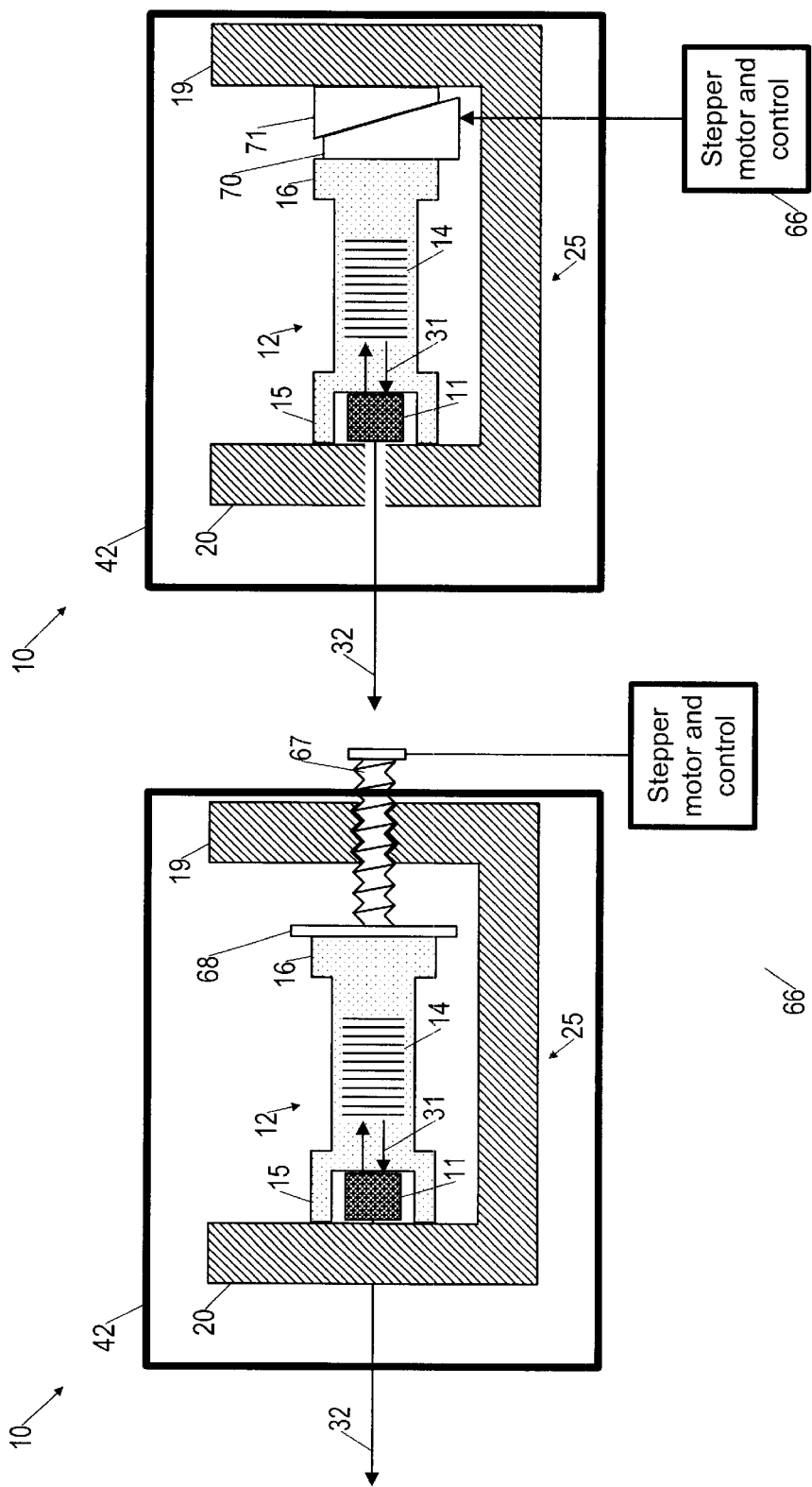

TUNABLE EXTERNAL CAVITY SEMICONDUCTOR LASER INCORPORATING A TUNABLE BRAGG GRATING

FIELD OF THE INVENTION

The present invention pertains to the field of communications using optical signals. More particularly, the present invention pertains to providing a Fabry-Perot laser made tunable by use of a tunable Bragg grating, such as e.g. a conventional Bragg grating or a sampled (Bragg) grating.

BACKGROUND OF THE INVENTION

Lasers used as light sources for optical communications are often fixed-frequency lasers, provided as a semiconductor laser chip coupled to an optical fiber and enclosed in a hermetically sealed package. The telecommunications applications today very often use wave division multiplexing (WDM), and in such applications, if fixed-frequency lasers are used, a laser must be provided for each different frequency/channel of a communication signal. To provide redundancy in such applications, a spare fixed-frequency laser must also be provided for each different frequency/channel of a communication signal. The trend today is toward so-called dense wave division multiplexing (DWDM) applications, aggravating the spares inventory requirement in case of using fixed-frequency lasers. Using tunable lasers as spares would allow keeping far fewer spares (than in the case of using fixed-frequency lasers) for the same overall system reliability.

As DWDM technology continues to develop, it is envisioned that communications networks will someday become substantially all optical, so that network functions typically performed by electrical components, such as adding and dropping signals from the network, will instead be performed optically. To perform optically the function of adding and dropping signals from a network, one optical component needed is a dynamically reconfigurable optical add/drop multiplexer (OADM), one that can be remotely commanded to reroute wavelengths, adding greater functionality and flexibility of the network to adjust to changing signal traffic patterns. Tunable lasers, switchable between wavelength channels, provided on the transmit side and on the add side of an OADM, are key to developing dynamically reconfigurable OADMs.

Typical semiconductor lasers for WDM communications are distributed feedback (DFB) designs intended to provide accurate wavelength control, narrow linewidth, and low-noise operation. Such lasers are sometimes thermally tuned, but thermal tuning is difficult to do precisely, and cannot usually provide tuning over as wide a range of frequencies as are needed in typical WDM applications. One type of semiconductor is a Fabry-Perot (FP) diode laser, for which wavelength stabilization is provided by coupling the emission of the FP laser to a reflective element so as to create an external cavity resonator that sets the lasing frequency. In some applications, a Bragg grating is used as a reflective element, feeding back, to an FP laser, light at a particular wavelength in a band of wavelengths emitted by the FP laser, and the lasing material of the FP laser then amplifies the reflected light. The FP laser is modified by providing an anti-reflective coating on the partially reflecting facet so that the FP laser changed from being a laser to instead being purely a semiconductor gain medium. The Bragg grating serves as the other reflective laser facet (cavity wall), and the Bragg grating and modified FP laser become, in combination, an external cavity semiconductor laser.

When using a Bragg grating as the other reflective cavity laser facet of a modified FP laser (i.e. in place of the facet modified to be non-reflective), the wavelength or wavelengths that are amplified are the overlap of the wavelengths reflected by the Bragg grating, the wavelengths associated with the length of the cavity defined by the Bragg grating and the reflective facet of the modified FP laser (semiconductor gain medium), and the wavelengths for which the lasing material of the modified FP laser actually lases. In such an external cavity semiconductor laser, the Bragg grating is positioned as near as possible to the non-reflective facet, so as to avoid lasing at more than one wavelength associated with oscillating modes of the cavity formed by the Bragg grating and the (unmodified, fully reflecting laser facet).

Modest tuning of such an FP laser can be achieved by providing for thermal tuning, but as explained above, such tuning is often not fully satisfactory for WDM applications. Strain tuning (mechanical tuning) of the Bragg grating of such an FP laser, in which the Bragg grating is made to reflect different wavelengths by applying compressive or tensile forces to the Bragg grating, has been attempted but the results of such attempts have often provided only impracticable designs.

Thus, for both optical communications systems generally, and in particular for at least some functions of a communications network that are today performed using electrical components, what is needed is a practical design for a mechanically (as opposed to thermally) tunable laser system including a tunable laser having a coupling mechanism for coupling to an optical waveguide.

SUMMARY OF THE INVENTION

Accordingly, the present invention provides a tunable external cavity laser system including: a semiconductor gain medium, for providing source light, responsive to reflected light at a reflected wavelength, the gain medium including a lasing material for amplifying the reflected light, and further for providing amplified reflected light; an elongated tuner housing having a tuner housing head and having a tuner housing foot, the tuner housing head and tuner housing foot being rigidly connected; a span of waveguide having a Bragg grating, the waveguide being a large-diameter waveguide so as to be able to respond to a compressive force applied along its longitudinal axis without significant buckling, the waveguide for receiving the source light and for providing in turn the reflected light, and having a waveguide head and a waveguide foot, the waveguide head abutting the tuner housing head and the waveguide foot disposed toward the tuner housing foot; and means such as a piezoelectric crystal but also other, purely mechanical means, for applying a compressive force, the means disposed so as to abut the waveguide foot and also to abut the tuner housing foot, the means responsive to a controller signal indicating the compressive force to be exerted on the span of waveguide along the direction of the longitudinal axis of the span of waveguide, the compressive force being sufficient to alter the Bragg grating so as to affect the wavelength of light reflected by the Bragg grating.

In another aspect of the invention, the semiconductor gain medium is integrated into the waveguide head of the span of waveguide.

In yet another aspect of the invention, the semiconductor gain medium is disposed so as to abut the outside of the tuner housing head and wherein the tuner housing head has a borehole provided axially therethrough for passage of light from the semiconductor gain medium and from the Bragg grating.

In yet still another aspect of the invention, the semiconductor gain medium is disposed in spaced apart relation to the outside of the tuner housing head, wherein the tuner housing head has a borehole provided axially therethrough for passage of light from the semiconductor gain medium and from the Bragg grating, and wherein the semiconductor gain medium and the waveguide are coupled via at least one aspheric lens.

The present invention also comprehends a stepped tunable external cavity laser, including: a semiconductor gain medium, for providing source light, responsive to reflected light at a reflected wavelength, the gain medium including a lasing material for amplifying the reflected light, and further for providing amplified reflected light; an elongated tuner housing having a tuner housing head and having a tuner housing foot, the tuner housing head and tuner housing foot being rigidly connected; a span of waveguide having a first sampled grating in a first section of the waveguide for receiving the source light, having a second sampled grating in a second section of the waveguide for receiving the source light, both gratings for providing in turn the reflected light, the two gratings having a different sample period, the span of waveguide also having a waveguide head and a waveguide foot, the waveguide head abutting the tuner housing head and the waveguide foot disposed toward the tuner housing foot; and means such as a piezoelectric crystal but also other, mechanical means, for applying a compressive force, the means for applying a compressive force disposed so as to abut the waveguide foot and also to abut the tuner housing foot, responsive to a controller signal indicating the compressive force to be exerted on the span of waveguide along the direction of the axis of the span of waveguide. In this embodiment, the first section and second section are of different thicknesses, and the sampled gratings are inscribed in the two sections so that at any given compressive force exerted by the piezoelectric crystal both gratings reflect at most one common wavelength. Thus, as the compressive force exerted by the piezoelectric crystal changes, the laser is tuned to the different aligning wavelengths of the two sampled gratings, and because the tuning jumps from one wavelength to another (as opposed to changing continuously), the tunable laser of this embodiment is said to be stepped.

BRIEF DESCRIPTION OF THE DRAWINGS

The above and other objects, features and advantages of the invention will become apparent from a consideration of the subsequent detailed description presented in connection with accompanying drawings, in which:

FIG. 5 is a schematic of a screw and stepper motor arrangement for applying a compressive force to the stiffened waveguide; and FIG. 6 is a schematic of a wedge pair and stepper motor arrangement for applying a compressive force to the stiffened waveguide.

BEST MODE FOR CARRYING OUT THE INVENTION

Figure 1:
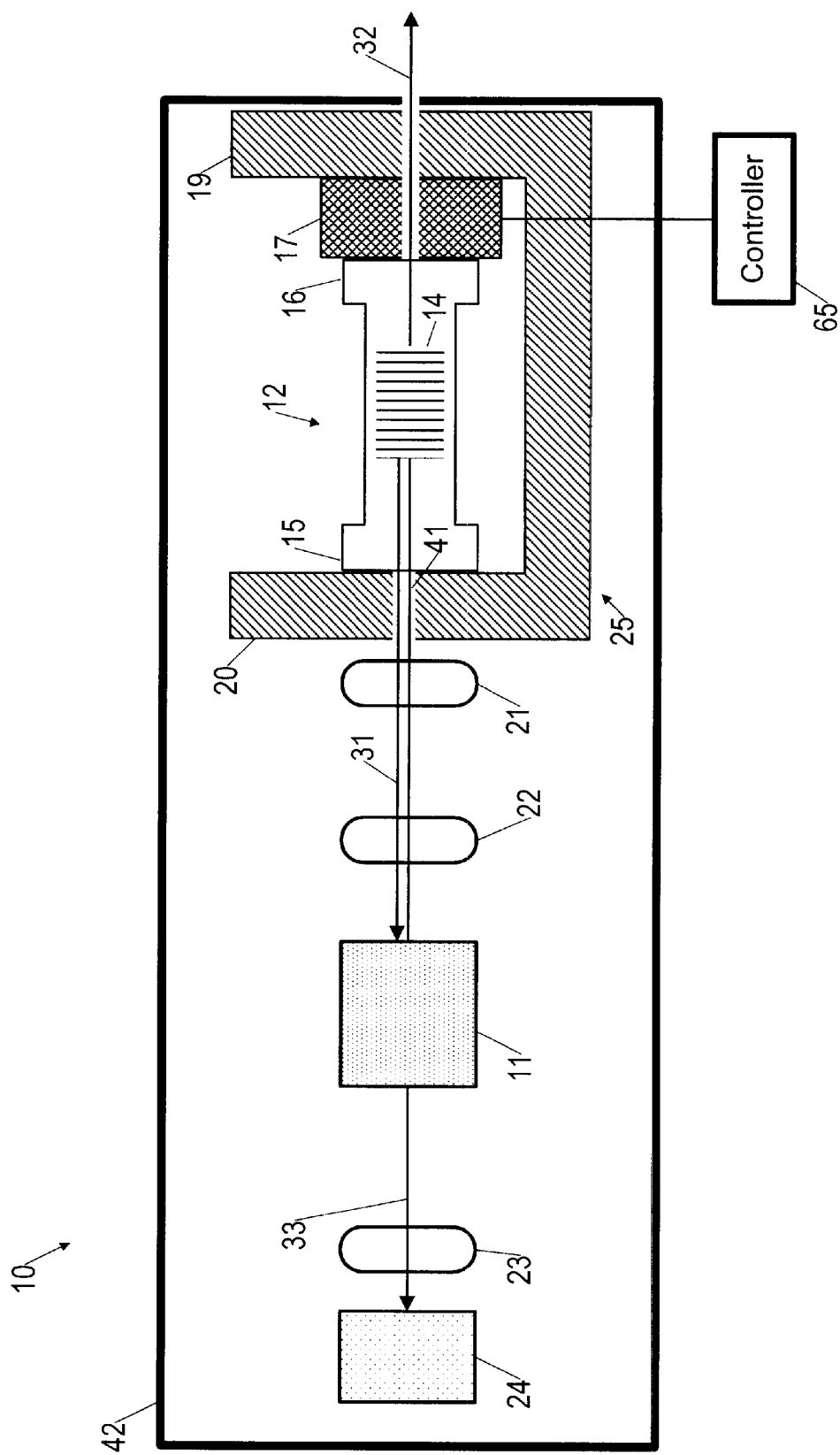
FIG. 1 is a schematic view of an a tunable laser system, according to the present invention, including a semiconductor gain medium and a tuner including a large diameter or stiffened waveguide having a Bragg grating with inter-element spacing that can be changed by a compressive force exerted by a piezoelectric crystal.
Figure 2:
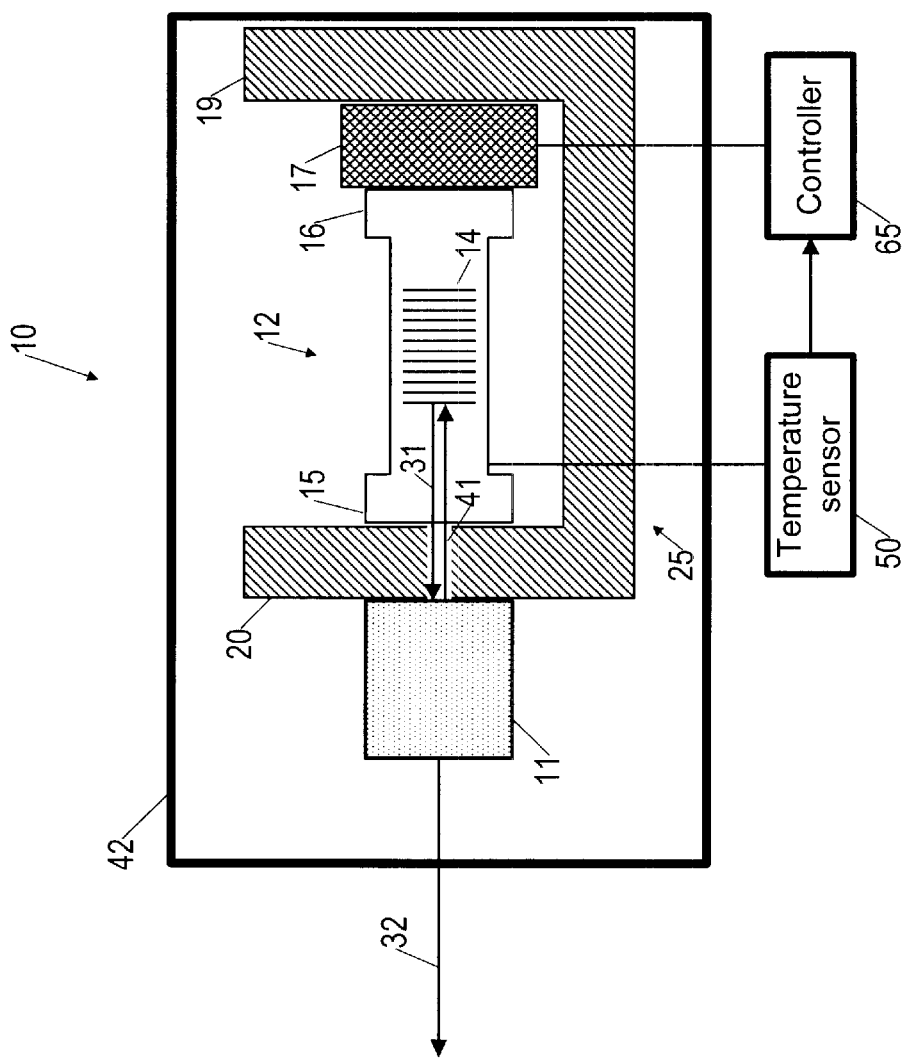
FIG. 2 is a schematic view of another embodiment of a tunable laser system, according to the present invention, also including a semiconductor gain medium and a tuner as in FIG. 1, but with the semiconductor gain medium abutting the tuner housing, so as to reduce the number of wavelengths of light (associated with different cavity modes) that are amplified by the gain medium.
Figure 3:
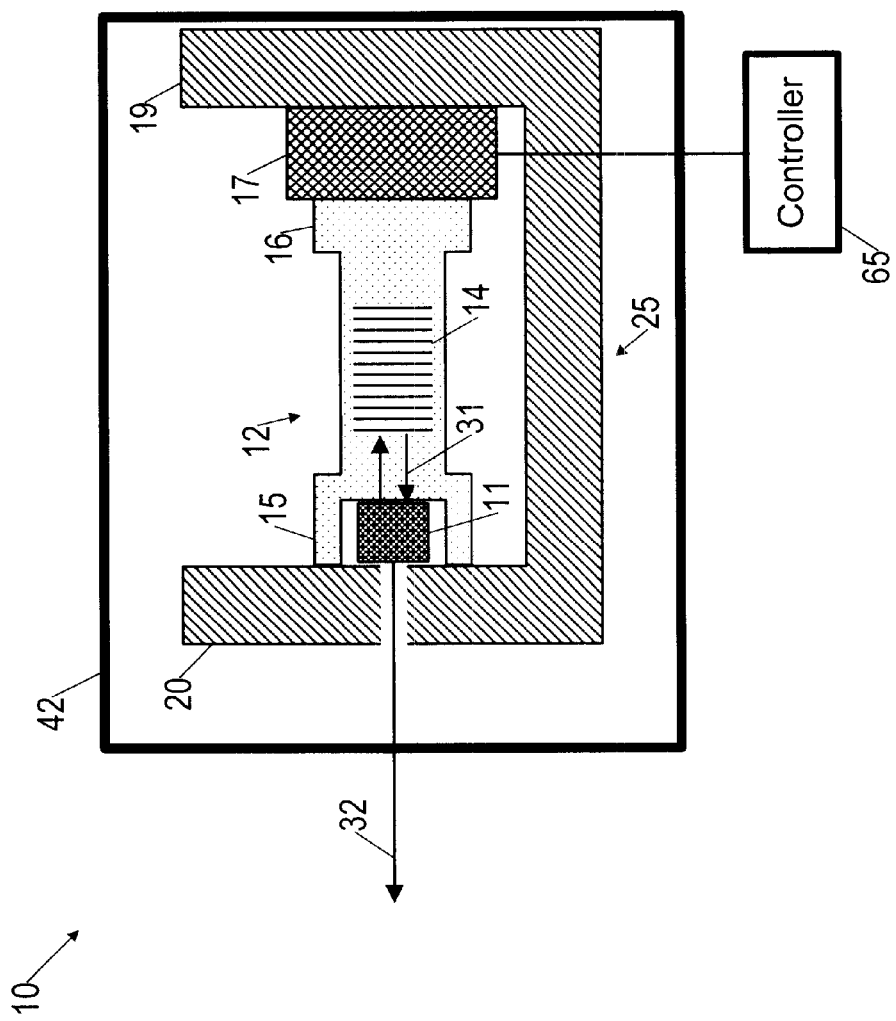
FIG. 3 is a schematic view of yet another embodiment of a tunable laser system according to the present invention, the preferred embodiment, also including a semiconductor gain medium and a tuner as in FIG. 1, but with the semiconductor gain medium integrated into the tuner housing, so as to reduce even further the number of wavelengths of light (associated with different cavity modes) that are amplified by the gain medium.

Referring now to FIGS. 1–3, a tunable laser 10 for optical communications is shown as including a semiconductor gain medium 11 coupled to a large diameter or stiffened waveguide 12 having a Bragg grating 14, where the stiffened waveguide 12 is compressed to a greater or lesser extent by a piezoelectric crystal 17 in response to an electric voltage applied to the crystal at the direction of a controller 65. The semiconductor gain medium 11, stiffened waveguide 12, and piezoelectric crystal 17 are all enclosed within a single hermetically sealed envelope 42 so as to impart to the tunable laser 10 high reliability and long lifetime.

The semiconductor gain medium is, in the preferred embodiment, made from a Fabry-Perot (FP) diode laser by applying an anti-reflective coating, typically a multi-layer coating of an appropriate dielectric, to the partially reflecting facet of the FP laser. Such a modification changes the FP laser into a semiconductor gain medium.

Light in a range of wavelengths is emitted by the semiconductor gain medium 11 and coupled to the stiffened waveguide 12 so as to reach the Bragg grating 14. Light at the particular wavelength reflected by the Bragg grating 14 returns to the semiconductor gain medium 11 and is then amplified as a result of the phenomenon of stimulated emission of radiation.

The stiffened waveguide 12 is caused to withstand compressive forces exerted by the piezoelectric crystal 17 by its being disposed so as to abut the piezoelectric crystal 17, and the two in series then being positioned so as to be captured by a tuner housing 25 having a tuner housing head 20 directly abutting the stiffened waveguide 12, and having a tuner housing foot 19 directly abutting a face of the piezoelectric crystal 17.

The stiffened waveguide 12 (also called a large diameter waveguide structure) is formed by glass collapsing technology shown and described in U.S. patent application Ser. No. 09/455,867 (CiDRA File No. CC 0036B), filed Dec. 6, 1999, as well as U.S. patent application Ser. No. 09/455,865 (CiDRA File No. CC-0078B), filed Dec. 6, 1999, both hereby incorporated by reference in their entirety, as discussed below in more detail. By way of example, the stiffened waveguide 12 can be formed by taking an optical fiber and inserting it into an alignment tube of an inner diameter slightly larger than that of the outer diameter of the optical fibers, which is then collapsed on the optical fiber. In particular, the stiffened waveguide 12 has a diameter of at least 3 millimeters and is formed by collapsing a first glass tube having a 1 millimeter diameter and a bore onto an optical fiber having a diameter of 125 microns arranged therein, then collapsing a second glass tube having a 3 millimeter diameter and a corresponding bore onto the first glass tube arranged therein.

The stiffened waveguide 12 can also be in the form of a single large diameter waveguide known as a cane structure, shown and described in U.S. patent application Ser. No. 09/455,868 (CiDRA File No. CC-0230), filed Dec. 6, 1999, as well as U.S. patent application Ser. No. 09/456,112 (CiDRA File No. CC-0129B), filed Dec. 6, 1999, both hereby incorporated by reference in their entirety. See U.S. patent application Ser. No. 09/456,112 (CiDRA File No. CC-0129), hereby incorporated by reference.

Referring now in particular to FIG. 1, the semiconductor gain medium 11 is disposed in spaced apart relation to the stiffened waveguide 12 and coupled to the Bragg grating of the stiffened waveguide via two aspheric lenses 21 22. Light passes between the semiconductor gain medium and the Bragg grating 14 via a borehole 41 through the tuner housing head 20. In the particular arrangement shown, the Bragg grating 14 is partially reflecting so that the (amplified) laser light from the semiconductor gain medium 11 is output by being transmitted through the Bragg grating 14 to emerge as a laser beam output 32. In addition, the semiconductor gain medium emits a laser beam 33 at a power level that is a fraction of that of the output laser beam 32, and is provided via a (usually simple) lens 23 to a monitor diode 24. The output of the monitor diode 24 is available to be used to indicate the power output of the tunable laser 10.

The return beam or feedback 31 from the Bragg grating 14 to the semiconductor gain medium 11 consists of light at the wavelength reflected by the Bragg grating 14 based on the state of strain of the piezoelectric crystal 17. In this embodiment, the semiconductor gain medium facet nearest the Bragg grating is essentially non-reflecting, whereas the facet nearest the monitor diode 24 is partially reflecting. It is also possible to dispense with the monitor diode 24, and by altering the reflectivity of the facet at the Bragg grating end of the semiconductor gain medium 11 and also that of the opposite facet, arrange for the output laser beam 32 to emerge in a direction leading away from the Bragg grating 14. For such an arrangement, the Bragg grating would be made essentially fully reflecting, the facet facing the Bragg grating would be made essentially transparent, and the facet facing away from the Bragg grating, in the direction of the output, would be made partially reflecting.

Referring now in particular to FIG. 2, another embodiment of tunable laser 10 according to the present invention is shown as one having the semiconductor gain medium 11 disposed so as to abut the tuner housing head 20, and so to couple light directly via the borehole 41 through the tuner housing head into the stiffened waveguide 12. In such an embodiment, the reflectivities of the facets of the semiconductor gain medium 11 are selected so that the laser output beam 32 is in the direction opposite to that of the Bragg grating 14. By positioning the semiconductor gain medium 11 so as to abut the tuner housing head and so be more proximal to the Bragg grating 14 than in the embodiment of FIG. 1, a smaller length cavity is created between the Bragg-grating-side facet of the semiconductor gain medium 11 and the Bragg grating itself. By shortening the cavity, wavelengths of the cavity modes are made more separated, and the number of cavity modes that are amplified (which are those cavity modes at a wavelength in the bandwidth of light reflected by the Bragg grating) are reduced, compared to embodiment with a larger cavity length. Also shown in FIG. 2 is an optional temperature sensor 50 that can be used to provide an indication of temperature of the grating 14 to the controller 65, which can then exert a compressive force adequate to compensate for the effect of any change in temperature of the grating.

Referring now in particular to FIG. 3, the preferred embodiment of a tunable laser 10 according to the present invention is shown as having a semiconductor gain medium 11 integrated within a (sometimes but not necessarily enlarged) head 15 of the stiffened waveguide 12. This arrangement further reduces the length between the Bragg-grating-side facet of the semiconductor gain medium 11 and the Bragg grating 14, and so further reduces the number of cavity resonator modes output by the tunable laser. The output beam 32 is shown emerging from the facet of the semiconductor gain medium 11 away from the Bragg grating 14. It is also possible to alter the reflectivity of the Bragg grating and the reflectivities of the facets of the semiconductor gain medium 11 so that the output beam passes through the Bragg grating 14 and on through the piezoelectric crystal 17 via a borehole (not shown) through the piezoelectric crystal.

Note that even in the embodiment of FIG. 1, the semiconductor gain medium 11 should be situated in close proximity (a few mm) to the Bragg grating 14 so as to minimize the number of oscillating modes operating within the Bragg reflection bandwidth. The embodiment shown in FIG. 3 allows having a gap, between the laser facet and the Bragg grating, of as little as a few hundred microns, so that the number of cavity resonator oscillating modes is substantially reduced from that of the FIG. 1 embodiment and even the FIG. 2 embodiment, and in addition coupling between the Bragg grating 14 and the semiconductor gain medium 11 is substantially increased.

Figure 4:
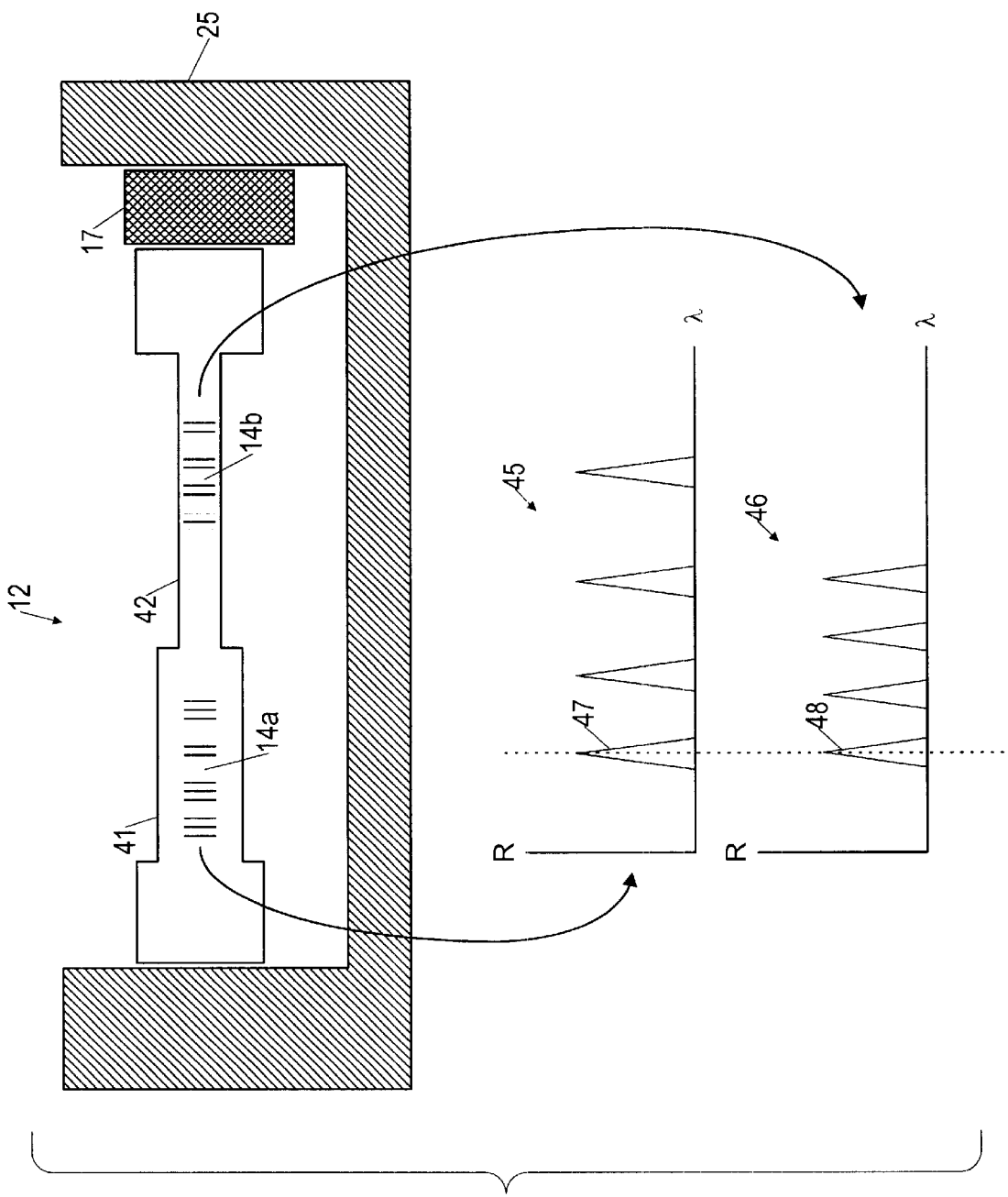
FIG. 4 is a schematic view a sectioned large diameter or stiffened waveguide, each section having a different thickness and each having a sampled grating, the gratings such that, of the different wavelengths reflected by each grating, only one wavelength is common to both gratings for a given compressive force on the large diameter or stiffened waveguide (a force exerted by for example a piezoelectric crystal.

Referring now to FIG. 4, in another embodiment of a tunable laser according to the present invention, the stiffened waveguide 12 has so-called sampled gratings 14a 14b with different sample periods in different sections 41 42, each section having a different thickness, and the stiffened waveguide again abuts a piezoelectric crystal 17, the stiffened waveguide and piezoelectric crystal again being captured by a housing 25. A sampled grating is a grating in which the elements are themselves gratings separated by a distance associated with the sample period. Such a grating reflects a set of wavelengths 45 46 rather than a single wavelength. When the piezoelectric crystal 17 is caused to exert a compressive force on the stiffened waveguide 12, the different sampled gratings 14a 14b compress differently, depending on the thickness of the section in which they are inscribed. The two different sampled gratings can be created so that for one compressive force exerted by the piezoelectric crystal, from among the sets 45 46 of wavelengths at which the two sampled gratings reflect, both gratings reflect only one common wavelength 47 48, and at any other compressive force, both sampled gratings reflect some other, different common wavelength, (or do not reflect at any common wavelength); the two sampled gratings can be so created because the interelement spacing of the sampled grating inscribed in the thinner section of the stiffened waveguide changes at a greater rate than the interelement spacing of the sampled grating inscribed in the thicker section. Thus, as the compressive force exerted by the piezoelectric crystal changes, different wavelengths reflected by the two sampled gratings align, so that the laser system of this embodiment is a stepped tunable laser system. It is of course possible to temperature-compensate the stepped tunable laser of this embodiment by using a temperature sensor and controller in a way similar to the embodiment shown in FIG. 2.

In some applications, instead of using a sampled grating in the stepped tunable laser of FIG. 4, it is advantageous to use multiple discrete or collated gratings in each section.

It is to be understood that the above-described arrangements are only illustrative of the application of the principles of the present invention. In particular, the present invention clearly includes other, more mechanical devices for applying a compressive force to the stiffened waveguide, besides a piezoelectric crystal, such as a lead screw 67 driven by a stepper motor (the term "stepper motor" to be understood in a general sense as any kind of motor suitable for causing a displacement of a desired amount) and controller 66 pushing on a plate 68 that in turn pushes on the stiffened waveguide 12, as shown in FIG. 5, and also, as in FIG. 6, a wedge pair 70 71, with one wedge 70 being moveable under the action of a stepper motor and controller 66, so as to be more or less in line with the other wedge 71 and also with the stiffened waveguide 12, thus exerting more or less compressive force on the stiffened waveguide. Numerous other modifications and alternative arrangements may be devised by those skilled in the art without departing from the spirit and scope of the present invention, and the appended claims are intended to cover such modifications and arrangements.

What is claimed is:

1. A tunable laser system, comprising:
   a) a semiconductor gain medium, for providing source light, responsive to reflected light at a reflected wavelength, the gain medium including a lasing material for amplifying the reflected light, and further for providing amplified reflected light;
   b) an elongated tuner housing having a tuner housing head and having a tuner housing foot, the tuner housing head and tuner housing foot being rigidly connected;
   c) a span of waveguide having a Bragg grating, the waveguide being a large-diameter waveguide so as to be able to respond to a compressive force applied along its longitudinal axis without significant buckling, the span of waveguide for receiving the source light and for providing in turn the reflected light, and having a waveguide head and a waveguide foot, the waveguide head abutting the tuner housing head and the waveguide foot disposed toward the tuner housing foot; and
   d) means for applying a compressive force, disposed so as to abut the waveguide foot and also to abut the tuner housing foot, responsive to a controller signal indicating the compressive force to be exerted on the span of waveguide along the direction of the longitudinal axis of the span of waveguide, the compressive force being sufficient to alter the Bragg grating so as to affect the wavelength of light reflected by the Bragg grating.

2. A tunable laser system as in claim 1, wherein the semiconductor gain medium is integrated into the waveguide head of the span of waveguide.

3. A tunable laser system as in claim 1, wherein the semiconductor gain medium is disposed so as to abut the outside of the tuner housing head and wherein the tuner housing head has a borehole provided axially therethrough for passage of light from the semiconductor gain medium and from the Bragg grating.

4. A tunable laser system as in claim 1, wherein the semiconductor gain medium is disposed in spaced apart relation to the outside of the tuner housing head, wherein the tuner housing head has a borehole provided axially therethrough for passage of light from the semiconductor gain medium and from the Bragg grating, and wherein the semiconductor gain medium and the waveguide are coupled via at least one lens.

5. A tunable laser system as in claim 4, wherein the lens coupling the semiconductor gain medium and the waveguide is an aspheric lens.

6. A tunable laser system as in claim 4, further comprising a monitor diode coupled to the semiconductor gain medium, the monitor diode for receiving a fraction of the output of the laser light emitted by the tunable laser system, for providing an indication of the power output of the tunable laser system.

7. A tunable laser system as in claim 1, further comprising a controller coupled to the means for applying a compressive force and also further comprising a temperature sensor, coupled to the controller, responsive to the temperature of the grating, the temperature sensor for providing an indication of the grating temperature to the controller, the controller in turn for applying a signal to the means for applying a compressive force based on the grating temperature, thereby providing a temperature-compensated tunable laser system.

8. A tunable laser system as in claim 1, wherein the means for providing a compressive force is a piezoelectric crystal, responsive to an electric voltage.

9. A tunable laser system as in claim 1, wherein the means for providing a compressive force is a plate in compressive contact with a screw, the screw being advanced or retarded under the influence of a motor, thereby varying the compressive force on the span of waveguide along the direction of the axis of the span of waveguide.

10. A tunable laser system as in claim 1, wherein the means for providing a compressive force is a pair of wedges, including a stationary wedge and a pushing wedge, the pushing we disposed relative to a motor and a motor arm so as to move under the influence of the motor and motor arm more or less into line with the stationary wedge, thereby varying the compressive force on the span of waveguide along the direction of the axis of the span of waveguide.

11. A tunable laser system, comprising:
   a) a semiconductor gain medium, for providing source light, responsive to reflected light at a reflected wavelength, the gain medium including a lasing material for amplifying the reflected light, and further for providing amplified reflected light;
   b) an elongated tuner housing having a tuner housing head and having a tuner housing foot, the tuner housing head and tuner housing foot being rigidly connected;
   c) a span of waveguide having a first sampled grating in a first section of the waveguide for receiving the source light, having a second sampled grating in a second section of the waveguide for receiving the source light, the two gratings having a different sample period, both gratings for providing in turn the reflected light, both sections of the waveguide being of large-diameter so as to be able to respond to a compressive force applied along its longitudinal axis without significant buckling, the span of waveguide also having a waveguide head and a waveguide foot, the waveguide head abutting the tuner housing head and the waveguide foot disposed toward the tuner housing foot; and
   d) means for applying a compressive force, disposed so as to abut the waveguide foot and also to abut the tuner housing foot, responsive to a controller signal indicating the compressive force to be exerted on the span of waveguide along the direction of the axis of the span of waveguide;

wherein the first section and second section are of different thicknesses, and the sampled gratings are inscribed in the two sections so that at any given compressive force exerted by the means for applying a compressive force, both gratings reflect at most one common wavelength.

* * * * *

UNITED STATES PATENT AND TRADEMARK OFFICE
CERTIFICATE OF CORRECTION

PATENT NO. : 6,470,036 B1
DATED : October 22, 2002
INVENTOR(S) : Timothy J. Bailey et al.

It is certified that error appears in the above-identified patent and that said Letters Patent is hereby corrected as shown below:

Column 4,
Line 12, "." after "that" should be deleted.

Column 8,
Line 39, "we" should be -- wedge --.

Signed and Sealed this

Twentieth Day of May, 2003

JAMES E. ROGAN
*Director of the United States Patent and Trademark Office*